United States Patent
Nagai et al.

(10) Patent No.: US 9,859,370 B2
(45) Date of Patent: Jan. 2, 2018

(54) SCHOTTKY BARRIER DIODE

(71) Applicant: ROHM CO., LTD., Kyoto (JP)

(72) Inventors: Yoshiteru Nagai, Kyoto (JP); Kohei Makita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/148,461

(22) Filed: Jan. 6, 2014

(65) Prior Publication Data

US 2014/0117487 A1    May 1, 2014

Related U.S. Application Data

(63) Continuation of application No. 13/182,164, filed on Jul. 13, 2011, now Pat. No. 8,624,347.

(30) Foreign Application Priority Data

Jul. 14, 2010 (JP) ................... 2010-159814

(51) Int. Cl.
H01L 29/47 (2006.01)
H01L 29/06 (2006.01)
H01L 29/872 (2006.01)

(52) U.S. Cl.
CPC ...... *H01L 29/0684* (2013.01); *H01L 29/0619* (2013.01); *H01L 29/0657* (2013.01); *H01L 29/872* (2013.01); *H01L 29/8725* (2013.01)

(58) Field of Classification Search
CPC ............... H01L 29/0684; H01L 29/872; H01L 29/8725
USPC ........ 257/452, 449, 473, 478, 484, 486, 483
See application file for complete search history.

(56) References Cited

U.S. PATENT DOCUMENTS

| | | | |
|---|---|---|---|
| 4,752,813 A | 6/1988 | Bhatia et al. | |
| 5,241,195 A * | 8/1993 | Tu | H01L 27/0788 257/155 |
| 5,262,668 A * | 11/1993 | Tu | H01L 29/872 257/475 |
| 5,262,669 A | 11/1993 | Wakatabe et al. | |
| 6,399,996 B1 * | 6/2002 | Chang et al. | 257/484 |
| 6,426,541 B2 * | 7/2002 | Chang | H01L 21/2815 257/472 |
| 7,064,408 B2 * | 6/2006 | Wu | H01L 27/0814 257/471 |
| 2002/0125541 A1 * | 9/2002 | Korec | H01L 27/0817 257/471 |
| 2005/0029514 A1 | 2/2005 | Moriya | |
| 2005/0167744 A1 * | 8/2005 | Yilmaz | 257/329 |
| 2006/0249806 A1 * | 11/2006 | Shirai et al. | 257/473 |

(Continued)

FOREIGN PATENT DOCUMENTS

| | | |
|---|---|---|
| JP | 61-180476 A | 8/1986 |
| JP | 04-321274 A | 11/1992 |

(Continued)

*Primary Examiner* — Marc Armand
*Assistant Examiner* — Wilner Jean Baptiste
(74) *Attorney, Agent, or Firm* — Rabin & Berdo, P.C.

(57) ABSTRACT

A Schottky barrier diode includes a semiconductor layer having a plurality of trenches formed by digging in from a top surface and having mesa portions formed between adjacent trenches, and a Schottky metal formed to contact the top surface of the semiconductor layer including inner surfaces of the trenches.

18 Claims, 8 Drawing Sheets

(56) References Cited

U.S. PATENT DOCUMENTS

| | | | |
|---|---|---|---|
| 2007/0262410 A1* | 11/2007 | Ono | H01L 27/0727 257/499 |
| 2008/0122323 A1 | 5/2008 | Spitz et al. | |
| 2008/0164556 A1 | 7/2008 | Kikuchi et al. | |
| 2008/0237852 A1* | 10/2008 | Yoshida et al. | 257/737 |
| 2009/0256197 A1* | 10/2009 | Nakazawa | H01L 29/0878 257/334 |

FOREIGN PATENT DOCUMENTS

| | | | |
|---|---|---|---|
| JP | 05-048080 A | 2/1993 | |
| JP | 08-512430 A | 12/1996 | |
| JP | 2000-031505 A | 1/2000 | |
| JP | 200022177 A | 1/2000 | |
| JP | 2000-252479 A | 9/2000 | |
| JP | 2003-282864 A | 10/2003 | |
| JP | 2005229071 A | 8/2005 | |
| JP | 3691736 B2 | 9/2005 | |
| JP | 2006318956 A | 11/2006 | |
| JP | 2008085187 A | 4/2008 | |
| JP | 2008-521226 A | 6/2008 | |
| JP | 2008-227112 A | 9/2008 | |
| JP | 4326762 B2 | 9/2009 | |
| JP | 09283771 A | 12/2009 | |
| JP | 2010016065 A | 1/2010 | |
| WO | WO 95-02258 A1 | 1/1995 | |

* cited by examiner

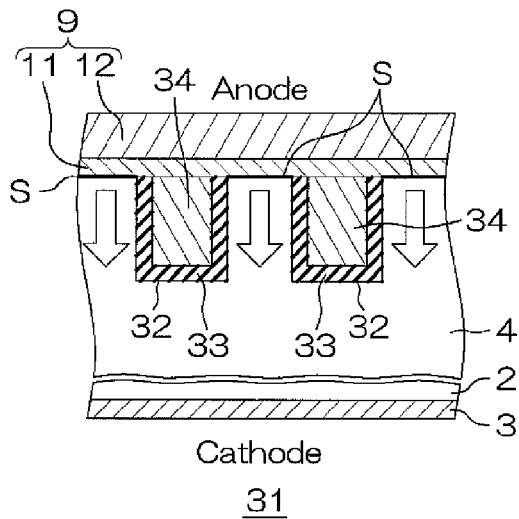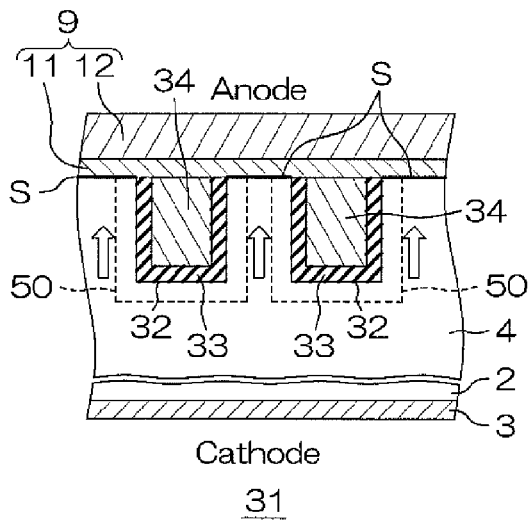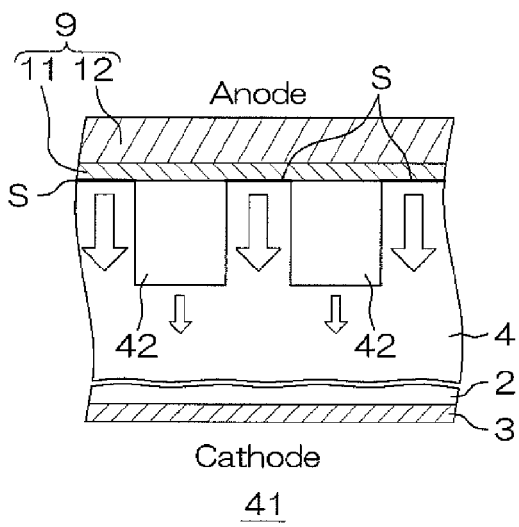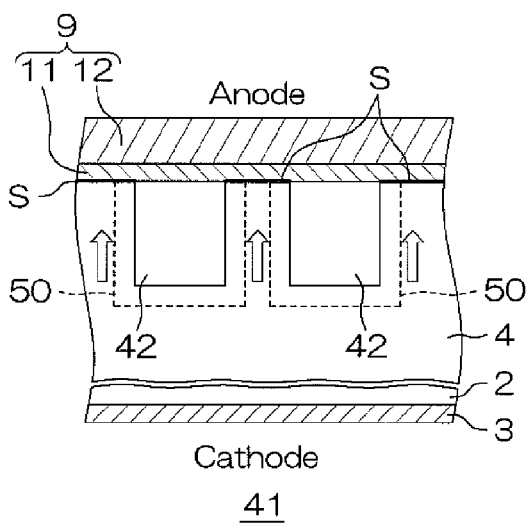

SCHOTTKY BARRIER DIODE

CROSS-REFERENCE TO RELATED APPLICATIONS

This application is a continuation of application Ser. No. 13/182,164, filed on Jul. 13, 2011. Furthermore, this application claims the benefit of priority of Japanese application No. 2010-159814 filed on Jul. 14, 2010. The disclosures of these prior U.S. and Japanese applications are incorporated herein by reference.

BACKGROUND OF THE INVENTION

Field of the Invention

The present invention relates to a Schottky barrier diode.

Description of Related Art

A Schottky barrier diode includes a semiconductor layer and a Schottky metal in contact with the semiconductor layer. A Schottky barrier is formed at an interface of the semiconductor layer and the Schottky metal. A plurality of structural examples of Schottky barrier diodes are disclosed a Japanese Patent No. 3691736. The structural examples to be compared with the invention of the present application are as follows. A first structural example (FIG. 11A of the Japanese Patent No. 3691736) is called a planar type and a Schottky metal is formed on a flat top surface of a semiconductor layer. A second structural example (FIG. 11C of the Japanese Patent No. 3691736) is called a trench diffusion type and columnar impurity diffusion layers are formed at intervals inside a semiconductor layer and a Schottky metal is formed on a top surface of the semiconductor layer. A Schottky junction is formed between the semiconductor layer top surface and the Schottky metal outside regions of the impurity diffusion layers (outside trenches). A third structural example (FIG. 2 of the Japanese Patent No. 3691736) is called a trench MOS type and an oxide film is formed on inner walls of trenches formed at intervals in a top layer portion of the semiconductor layer and polysilicon is embedded inside the trenches so as to contact the oxide film. A Schottky metal is formed to contact the polysilicon and the semiconductor layer outside the trenches. A Schottky junction is an interface of the semiconductor layer top surface and the Schottky metal outside the trenches.

SUMMARY OF THE INVENTION

With all of the arrangements disclosed in the Japanese Patent No. 3691736, the Schottky junction surface is small in area and it is thus difficult to increase a rated current or to decrease a forward voltage (VF).

More specifically, with the planar type Schottky barrier diode, the area of the Schottky junction surface must be made large to make a large current flow. However, chip size must be enlarged for this purpose and thus a Schottky barrier diode that is compact and high in rated current cannot be realized. The same problem is faced when the forward voltage is to be decreased in the planar type Schottky barrier diode because the area of the Schottky junction surface must be increased in this case as well.

In the case of the trench diffusion type and trench MOS type Schottky barrier diodes, the Schottky junction surface is formed on the semiconductor layer top surface outside the trenches. An even larger chip size than that required with the planar type Schottky barrier diode is thus required in order to increase the area of the Schottky junction surface.

The present invention thus provides a Schottky barrier diode with which the area of the Schottky junction surface can be increased even with a small chip size.

The above and yet other objects, features, and effects of the present invention shall be made clearer by the following description of the preferred embodiments with reference to the drawings.

BRIEF DESCRIPTION OF THE DRAWINGS

FIG. 5A is a schematic sectional view of principal portions of a trench MOS type diode according to a Comparative Example 2 showing a state where a forward bias is applied, and FIG. 5B is a schematic sectional view of the principal portions of the trench MOS type diode showing a state where a reverse bias is applied.

FIG. 6A is a schematic sectional view of principal portions of a trench diffusion type diode according to a Comparative Example 3 showing a state where a forward bias is applied, and FIG. 6B is a schematic sectional view of the principal portions of the trench diffusion type diode showing a state where a reverse bias is applied.

DETAILED DESCRIPTION OF THE PREFERRED EMBODIMENTS

Figure 1:
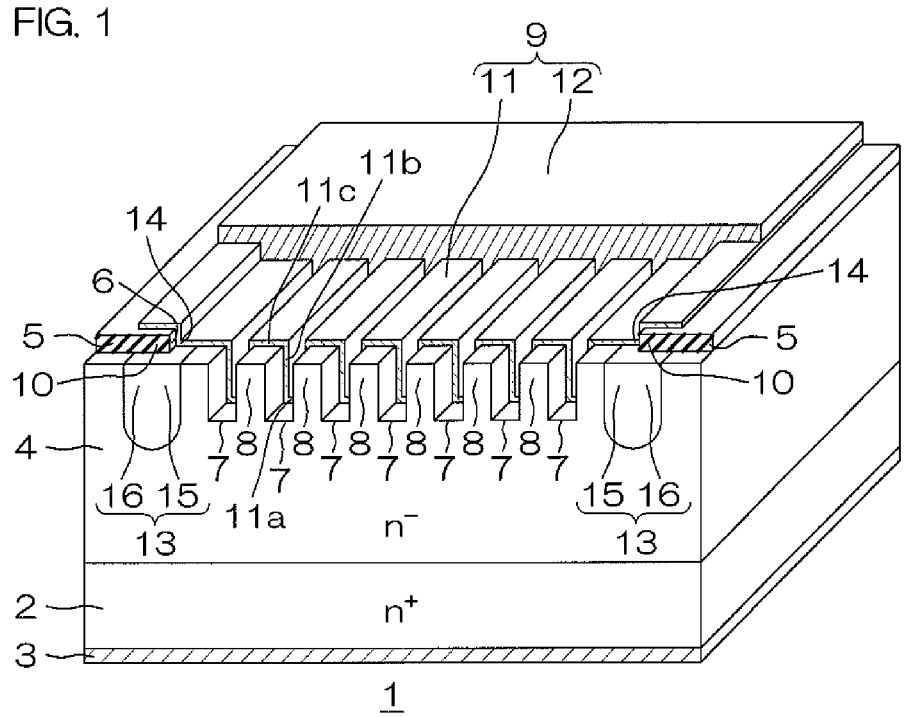
FIG. 1 is a schematic perspective view, partially broken away and viewed from obliquely above, of a Schottky barrier diode according to a preferred embodiment of the present invention.

A Schottky barrier diode according to a preferred embodiment of the present invention includes a semiconductor layer having a plurality of trenches formed by digging in from a surface and having mesa portions formed between adjacent trenches, and a Schottky metal formed to contact the surface of the semiconductor layer including inner surfaces of the trenches.

With the present arrangement, the plurality of trenches are formed in a top layer portion of the semiconductor layer and the Schottky metal contacts the surface of the semiconductor layer including the inner surfaces of the trenches. An area of a Schottky junction surface can thereby be made greater than an apparent area of the top surface of the semiconductor layer in plan view as viewed downward along a direction of a normal to the top surface of the semiconductor layer. That is, the Schottky junction surface can be formed on the inner surfaces of the trenches and the top surface of the semiconductor layer outside the trenches (top surfaces of the mesa portions). A total of these areas is greater than the apparent area of the semiconductor layer in plan view. A Schottky barrier diode having a Schottky junction surface with a large area can thereby be realized even with a small chip size. Consequently, a Schottky barrier diode of high rated current or a Schottky barrier diode of low forward voltage can be realized with a small chip size.

Also, a depletion layer that spreads from the Schottky junction surface is thick at the mesa portions formed between adjacent trenches and is thin near bottom portions of the trenches. The thick depletion layer near the mesa portions contributes to reduction in leak current during reverse bias application.

Preferably, the Schottky metal contacts the surface of the semiconductor layer at the inner surfaces of the trenches and outside the trenches. Also, preferably, the Schottky metal covers entireties of the inner surfaces of the trenches and extends continuously outside the trenches.

Preferably, each of the mesa portions has a width of 0.2 μm to 1.0 μm. The width of a mesa portion corresponds to an interval between trenches. When the interval between trenches is wide, the depletion layer at the mesa portion stays within a region inside the mesa portion. In this case, the depletion layer near the trench bottom portions is thin and the leak current during reverse biasing may be high near the trench bottom portions. Further, the increase in the area of the Schottky junction surface is low and the amount of reduction in the forward voltage is low. On the other hand, if the interval between trenches is narrow, the depletion layer at the mesa portion spreads to regions outside the mesa portion and the depletion layer near the trench bottom portions thickens. Although the leak current during reverse biasing can thereby be suppressed, effects of current increase and forward voltage reduction are decreased because a serial resistance of each trench bottom portion increases. Thus, by setting the width of each mesa portion (the interval between trenches) in a range of 0.2 μm to 1.0 μm, the depletion layer can be made to have a thickness of appropriate value near the trench bottom portions. Specifically, in comparison to a planar type Schottky barrier diode of the same chip size, a larger current can be made to flow, the forward voltage can be decreased, and the reverse leak current can be suppressed to a similar level.

Preferably, each of the trenches has a depth of 0.1 μm to 1.0 μm. If the trenches are deep, the depletion layer at the mesa portions does not readily fill the mesa portions and the depletion layer is thin at the trench bottom portions. If the trenches are shallow, the depletion layer of the mesa portions readily fills the mesa portions and spreads to regions outside the mesa portions and thus the depletion layer is thick at the trench bottom portions. Thus, by setting the trench depth in a range of 0.1 μm to 1.0 μm, the depletion layer can be made to have a thickness of appropriate value near the trench bottom portions. Specifically, in comparison to the planar type Schottky barrier diode of the same chip size, a larger current can be made to flow, the forward voltage can be decreased, and the reverse leak current can be suppressed to a similar level.

Preferably, a ratio of the mesa portion width with respect to the trench depth (mesa portion width/trench depth) is 0.2 to 10. The depletion layer can thereby be made to have a thickness of appropriate value near the trench bottom portions. Specifically, in comparison to the planar type Schottky barrier diode of the same chip size, a larger current can be made to flow, the forward voltage can be decreased, and the reverse leak current can be suppressed to a similar level.

Preferably, the plurality of trenches are formed in a stripe form. Besides this, a lattice shape, hole shapes positioned discretely in two dimensions, etc., are examples of shapes of the trenches. By forming the trenches in stripe form, the trench interval and width can be controlled accurately in a manufacturing process. Device characteristics can thereby be obtained readily as designed.

Preferred embodiments of the present invention shall now be described in detail with reference to the attached drawings.

Figure 2:
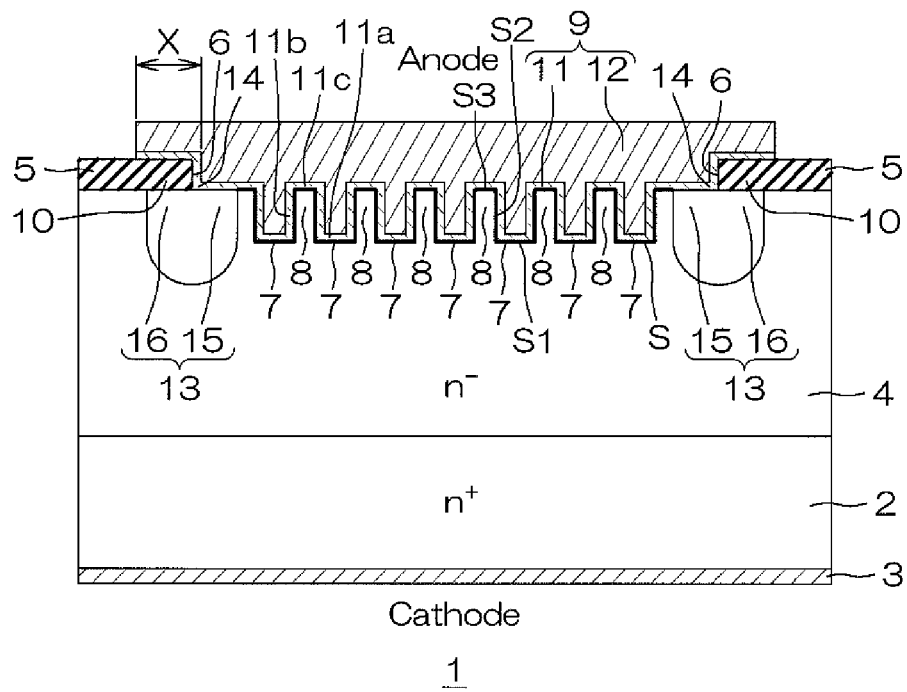
FIG. 2 is a schematic sectional view of the Schottky barrier diode shown in FIG. 1.

FIG. 1 is a schematic perspective view, viewed from obliquely above, of a Schottky barrier diode according to a preferred embodiment of the present invention, and for convenience of description, respective portions are broken away along different sectioning planes. FIG. 2 is a schematic sectional view, sectioned along a plane, of the Schottky barrier diode shown in FIG. 1.

The Schottky barrier diode 1 according to the preferred embodiment of the present invention is formed, for example, to a chip form of rectangular shape in plan view with the orientation in FIG. 1 being a reference orientation. A length of each of the four sides of the Schottky barrier diode 1 in plan view is, for example, approximately several mm.

As show in FIG. 1 and FIG. 2, the Schottky barrier diode 1 includes a silicon substrate 2 of an n+ type (for example, with an n type impurity concentration of $1 \times 10^{18}$ to $1 \times 10^{21}$ $cm^{-3}$). A cathode electrode 3 is formed on a rear surface of the silicon substrate 2 so as to cover the entire rear surface. The cathode electrode 3 is made of a metal (for example, Au, nickel (Ni) silicide, cobalt (Co) silicide, etc.) that can be in ohmic contact with the n type silicon.

An epitaxial layer 4 (semiconductor layer) of an n− type (for example, with an n type impurity concentration of $1 \times 10^{15}$ to $1 \times 10^{17}$ $cm^{-3}$) of lower concentration than the silicon substrate 2 is laminated on a top surface of the silicon substrate 2. A thickness of the epitaxial layer 4 is, for example, 2 μm to 20 μm.

A field insulating film 5 made of silicon oxide ($SiO_2$) is laminated on a surface of the epitaxial layer 4. A thickness of the field insulating film 5 is, for example, no less than 1000 Å and is preferably 7000 Å to 40000 Å. The field insulating film 5 may instead be made of another insulating substance, such as silicon nitride (SiN), etc.

An opening 6 (see FIG. 2) that exposes a central portion of the epitaxial layer 4 is formed in the field insulating film 5. In a top layer portion of the central portion of the epitaxial layer 4, a plurality of trenches 7 are formed by digging in from the top surface of the epitaxial layer 4. Each trench 7 is a longitudinal groove that extends along a predetermined direction. A bottom surface of each trench 7 is a flat surface parallel to the top surface of the epitaxial layer 4. Each trench 7 thus has a cross section of substantially rectangular shape. In the present preferred embodiment, seven trenches 7 extend in parallel at predetermined intervals. The trenches 7 are thus formed to a stripe form in plan view (see FIG. 1). For example, a pair of side wall surfaces of each trench 7 may be substantially parallel to a direction of a normal to the top surface of the epitaxial layer 4 (thickness direction of the epitaxial layer 4). In this case, a surface area of the central portion of the epitaxial layer 4 is increased by an amount corresponding to the side wall surfaces of the trenches 7 in comparison to a case where the trenches 7 are not formed.

At the top layer portion of the epitaxial layer 4, a mesa portion 8 is formed at each portion sandwiched by adjacent trenches 7. In the case where each trench 7 has a substantially rectangular cross section, each mesa portion 8 has a substantially rectangular cross section accordingly. Each mesa portion 8 has a pair of side wall surfaces (side wall surfaces of the trench 7), which, for example, rise substantially perpendicularly from respective edges at one side of the bottom surfaces of the pair of adjacent trenches 7 and an upper surface (top surface of the epitaxial layer 4) joining together the pair of side wall surfaces.

An anode electrode 9 is formed on the epitaxial layer 4. The anode electrode 9 fills an interior of the opening 6 of the field insulating film 5 and projects outside the opening 6 so as to cover a peripheral portion 10 of the opening 6 in the field insulating film 5. That is, over its entire periphery, the peripheral portion 10 of the field insulating film 5 is sandwiched from above and below by the epitaxial layer 4 and the anode electrode 9. A projection amount X by which the anode electrode 9, covering the peripheral portion 10 of the field insulating film 5, projects from an edge of the opening 6 of the field insulating film 5 is, for example, no less than 10 μm and is preferably 10 μm to 100 μm.

The anode electrode 9 has a multilayer structure (a two-layer structure in the present preferred embodiment) that includes a Schottky metal 11 joined to the epitaxial layer 4 inside the opening 6 of the field insulating film 5 and a contact metal 12 laminated on the Schottky metal 11.

The Schottky metal 11 is made of a metal (for example, titanium (Ti) or molybdenum (Mo) or palladium (Pd), etc.) that forms a Schottky junction by junction with the n type silicon. In the present preferred embodiment, Ti is used. The Schottky metal 11 is formed so as to contact the surface of the epitaxial layer 4 including the inner surfaces (bottom surfaces and pairs of side wall surfaces) of the trenches 7. The Schottky metal 11 thus contacts the surface of the epitaxial layer 4 at the inner surfaces of all of the trenches 7 and outside the trenches 7. Also, the Schottky metal 11 covers the entireties of the inner surfaces of the trenches 7 and extends continuously outside the trenches 7. The Schottky metal 11 is thus joined to the surface of the epitaxial layer 4 exposed from the opening 6 so as to cover the entirety of the surface. In the present preferred embodiment, the Schottky metal 11 includes bottom surface portions 11a in contact with the bottom surfaces of the trenches 7, side surfaces portions 11b in contact with the side wall surfaces of the trenches 7 (side wall surfaces of the mesa portions 8), and upper surface portions 11c in contact with upper surfaces of the mesa portions 8.

In this case, a junction surface (Schottky junction surface) S of the Schottky metal 11 and the surface of the epitaxial layer 4 is formed to have an uneven cross section in the region inside the opening 6 as indicated by thick lines as shown in FIG. 2. An area of the Schottky junction surface S is thus greater than an apparent area of the epitaxial layer 4 in plan view when the top surface of the epitaxial layer 4 (portion extending in a horizontal direction in FIG. 2) is viewed downward along the direction of the normal thereto. More specifically, the Schottky junction surface S includes bottom surface portions S1 in contact with the bottom surfaces of the trenches 7, side surfaces portions S2 in contact with the side wall surfaces of the trenches 7 (side wall surfaces of the mesa portions 8), and upper surface portions S3 in contact with the upper surfaces of the mesa portions 8. In the case where the trenches have substantially rectangular cross sections, the Schottky junction surface S can be made larger by an amount corresponding to the side surface portions S2 in comparison to the case where the trenches 7 are not formed.

The Schottky metal 11 joined to the epitaxial layer 4 forms a Schottky barrier (potential barrier) of, for example, 0.52 eV to 0.9 eV with respect to the silicon semiconductor making up the epitaxial layer 4. Also, a thickness of the Schottky metal 11 in the present preferred embodiment is, for example, 0.02 μm to 0.2 μm.

The contact metal 12 is a portion of the anode electrode 9 that is exposed at a topmost surface of the Schottky barrier diode 1 and is the portion to which bonding wires, etc., are joined. The contact metal 12 is made, for example, of aluminum (Al). In the present preferred embodiment, a thickness of the contact metal 12 is greater than that of the Schottky metal 11 and is, for example, 0.5 μm to 5 μm. The contact metal 12 is embedded in the respective trenches 7 so as to contact the Schottky metal 11 covering the inner surfaces of the respective trenches 7. That is, the contact metal 12 contacts the respective bottom surface portions 11a, the pairs of side surface portions 11b, and the upper surface portions 11c of the Schottky metal 11. The contact metal 12 is thus formed to have an uneven cross section at the side at which it contacts the Schottky metal 11 in the respective trenches 7. A top surface of the contact metal 12 at the opposite side of the side in contact with the Schottky metal 11 is flat and parallel to the top surface (excluding the inner surfaces of the trenches 7) of the epitaxial layer 4.

Figure 2A:
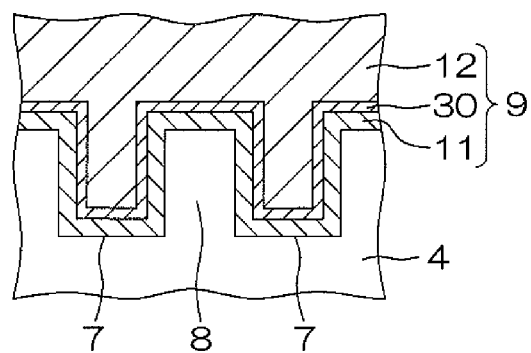
FIG. 2A is a partial sectional view of a detailed arrangement example of an anode electrode.

In a case where the Schottky metal 11 is made of Ti, a titanium nitride (TiN) layer 30 may be interposed between the Schottky metal 11 and the contact metal 12 made of Al as shown in FIG. 2A. The TiN layer 30 adheres together the Ti of the Schottky metal 11 and the Al of the contact metal 12, secures conductivity between Ti and Al, and further functions as a barrier layer that suppresses mutual diffusion of Ti and Al. Such a barrier layer protects the Schottky junction surface S by suppressing or preventing the diffusion of the material of the contact metal 12 to the Schottky metal 11.

A top surface protection film (not shown) may be formed on a topmost surface of the Schottky barrier diode 1. In this case, an opening that exposes the contact metal 12 is formed in a central portion of the top surface protection film. External connection members, such as bonding wires, are joined to the contact metal 12 through this opening.

A guard ring 13 made of a p type diffusion layer is formed in a top layer portion of the epitaxial layer 4 so as to contact the Schottky metal 11. The guard ring 13 is formed along an outline of the opening 6 of the field insulating film 5 so as to span across the interior and the exterior of the opening 6 in plan view. The guard ring 13 thus includes an inner side portion 15 projecting to the inner side of the opening 6 and contacting an outer edge portion 14 that is a terminal portion of the Schottky metal 11 inside the opening 6, and an outer side portion 16 projecting to the outer side of the opening 6 and opposing the anode electrode 9 (the Schottky metal 11 on the peripheral portion 10) across the peripheral portion 10 of the field insulating film 5. The guard ring 13 has a depth from the top surface of the epitaxial layer 4 of, for example, 0.5 μm to 8 μm.

The guard ring 13 formed across the interior and the exterior of the opening 6 covers a boundary portion of the peripheral portion 10 of the field insulating film 5 and the Schottky metal 11 from the epitaxial layer 4 side. If the guard ring 13 is not present, an electric field may concentrate at the boundary portion when a reverse bias is applied to the Schottky barrier diode 1 and a leak may occur readily. With the structure of the present preferred embodiment, the guard ring 13 covers the boundary portion and thus the concentration of electric field can be alleviated by a depletion layer that spreads from the guard ring 13 when a reverse bias is applied and a leak can be suppressed accordingly. Breakdown voltage of the Schottky barrier diode 1 is thereby improved.

To manufacture the Schottky barrier diode 1, first the epitaxial layer 4 made of the n⁻ type silicon is grown on the n⁺ type silicon substrate 2. Here, for example, P or As may be used as the n type impurity.

The trenches 7 are then formed by anisotropic etching using an unillustrated resist pattern as a mask. The resist pattern has, for example, a stripe-like opening pattern in a region positioned at the opening 6 in the epitaxial layer 4. Inside the opening pattern, the trenches 7 are formed by selective digging from the top surface of the epitaxial layer 4.

Selective ion implantation of a p type impurity (for example, B) is then performed on a region of the top layer portion of the epitaxial layer 4 outside the region in which the trenches 7 have been formed. Then, by performing an annealing process, the p-type impurity is activated and the guard ring 13 made of the p type diffusion layer is thereby formed in the epitaxial layer 4.

The field insulating film 5 made of $SiO_2$ is then formed on the epitaxial layer 4.

The field insulating film 5 is then etched using an unillustrated resist pattern as a mask to form the opening 6 that exposes the central portion of the epitaxial layer 4 and a portion of the guard ring 13.

Ti is then deposited on the surfaces of the epitaxial layer 4 and the field insulating film 5 by a sputtering method to form a Ti layer. The Ti layer is patterned by photolithography to form the Schottky metal 11. The Schottky metal 11 is formed so as to contact the guard ring 13 and cover the entirety of the surface of the epitaxial layer 4 (including the inner surfaces of the respective trenches 7) inside the opening 6.

Al is then deposited onto the Schottky metal 11 by a sputtering method, and the resulting Al layer is patterned by photolithography to form the contact metal 12.

The cathode electrode 3 is then formed on the rear surface of the silicon substrate 2 by the sputtering method.

The Schottky barrier diode 1 is completed by the above.

Figure 3A:
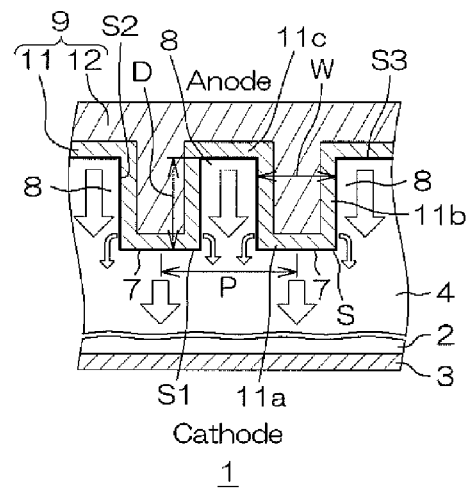
FIG. 3A is a schematic sectional view of principal portions of the Schottky barrier diode showing a state where a forward bias is applied.
Figure 3B:
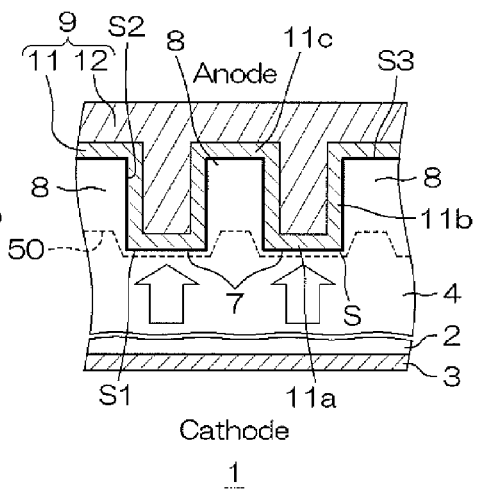
FIG. 3B is a schematic sectional view of the principal portions of the Schottky barrier diode showing a state where a reverse bias is applied.

FIG. 3A and FIG. 3B are schematic sectional views of principal portions of the Schottky barrier diode.

The trenches 7 of substantially rectangular cross sections that are formed in the stripe form are defined by a depth D, a width W, and a pitch P. The depth D is a distance from the top surface of the epitaxial layer 4 to the bottom surface of each trench 7 in the direction of the normal to the top surface (topmost surface) of the epitaxial layer 4. The width W is an opposing interval of the pair of opposing side wall surfaces of each trench 7. Specifically, the opposing interval is a distance between the pair of side wall surfaces in a direction of alignment of the trenches 7 (the direction orthogonal to a longitudinal direction of each trench 7 and parallel to a principal surface of the epitaxial layer 4). The pitch P is an interval between centers of adjacent trenches 7. The pitch P is a distance between centers of the trenches 7.

Schottky barrier diodes according to Comparative Examples shall now be described. As Schottky barrier diodes according to Comparative Examples, a planar type diode 21 (Comparative Example 1), a trench MOS type diode 31 (Comparative Example 2), and a trench diffusion type diode 41 (Comparative Example 3) shall be described.

Figure 4A:
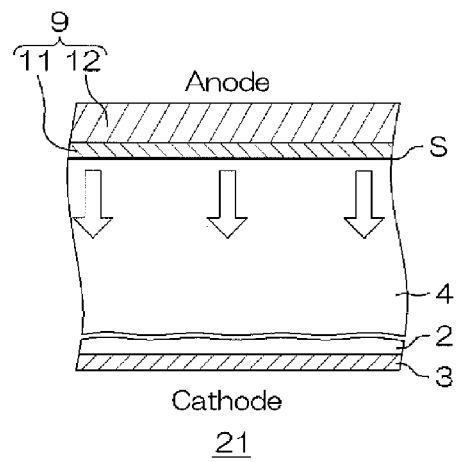
FIG. 4A is a schematic sectional view of principal portions of a planar type diode according to a Comparative Example 1 showing a state where a forward bias is applied.
Figure 4B:
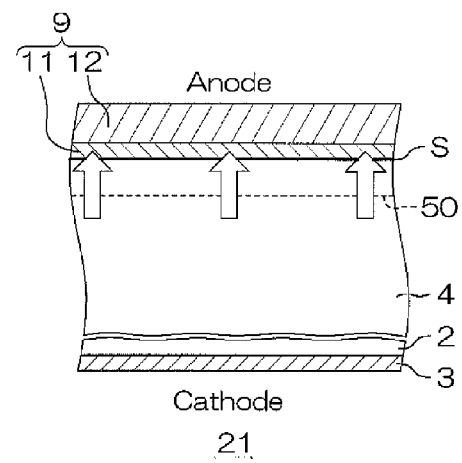
FIG. 4B is a schematic sectional view of the principal portions of the planar type diode showing a state where a reverse bias is applied.

FIG. 4A and FIG. 4B are schematic sectional views of principal portions of the planar type diode according to the Comparative Example 1. FIGS. 5A and 5B are schematic sectional views of principal portions of the trench MOS type diode according to the Comparative Example 2. FIG. 6A and FIG. 6B are schematic sectional views of principal portions of the trench diffusion type diode according to the Comparative Example 3.

In the Comparative Examples 1 to 3, portions corresponding to the portions described with the Schottky barrier diode 1 described above shall be provided with the same reference symbols and description thereof shall be omitted.

In the planar type diode 21 shown in FIG. 4A and FIG. 4B, recessed portions, such as trenches 7, are not formed in a portion exposed from the opening 6 (see FIG. 2) in the surface of the epitaxial layer 4 and this portion is flat over its entirety. The Schottky metal 11 is formed to cover the surface of such a flat epitaxial layer 4. In this case, the apparent area of the epitaxial layer 4 in plan view and the area of the Schottky junction surface S indicated by the thick lines are practically equal.

In the trench MOS type diode 31 shown in FIG. 5A and FIG. 5B, trenches 32 are formed at intervals in the top layer portion of the epitaxial layer 4. An oxide film 33 is formed on an inner wall of each trench 32, and a polysilicon 34 is embedded in the trench 32 so as to contact the oxide film 33. The Schottky metal 11 is formed so as to contact the polysilicon 34 and the top surface of the epitaxial layer 4 outside the trenches 32. In this case, the Schottky junction surface S is a portion of the top surface of the epitaxial layer 4 outside the trenches 32 as indicated by the thick lines. The area of the Schottky junction surface S is thus less than the apparent area of the epitaxial layer 4 in plan view.

In the trench diffusion type diode 41 shown in FIG. 6A and FIG. 6B, columnar impurity diffusion layers 42 are formed at intervals in the top layer portion of the epitaxial layer 4 and the Schottky metal 11 is formed on the top surface of the epitaxial layer 4. In this case, an interface of each impurity diffusion layer 42 and the epitaxial layer 4 is a pn junction. The Schottky junction surface S is the portion of the top surface of the epitaxial layer 4 outside the impurity diffusion layers 42. The area of the Schottky junction surface S is thus less than the apparent area of the epitaxial layer 4 in plan view.

Here, it shall be supposed that the apparent areas of the epitaxial layers 4 in plan view of the Schottky barrier diode 1 according to the preferred embodiment of the present invention and the diodes according to the Comparative Examples 1 to 3 are equal. In this case, the area of the Schottky junction surface S is greatest in the Schottky barrier diode 1 according to the preferred embodiment of the present invention. The area of the Schottky junction surface S of the planar type diode 21 (Comparative Example 1) is greater than the area of the Schottky junction surface S of each of the trench MOS type diode 31 (Comparative Example 2) and the trench diffusion type diode 41 (Comparative Example 3).

Operation principles of the respective diodes when a bias is applied in the forward direction or the reverse direction across the anode and cathode shall now be described. As an example, the forward bias is 0.5V and the reverse bias is 30V. Each of the open arrows illustrated in each of FIG. 3A to FIG. 6B indicates the flow of current when a bias is applied.

A state where a forward bias is applied to the Schottky barrier diode 1 according to the preferred embodiment of the present invention is schematically shown in FIG. 3A. In the Schottky junction surface S of uneven cross section, a current flows in the forward direction towards the cathode electrode 3 respectively from the top surface of the epitaxial layer 4 (the surface excluding the inner surfaces of the trenches 7) and the side wall surfaces (inner surfaces besides the bottom surface) and the bottom surface of each trench 7.

When a forward bias is applied to the planar type diode 21, a current flows from the flat Schottky junction surface S toward the cathode electrode 3 as shown in FIG. 4A. With the Schottky barrier diode 1 according to the preferred embodiment of the present invention, the area of the Schottky junction surface S is greater than in the planar type diode 21 and thus a large current can be made to flow in the forward direction (see FIG. 3A). Also, with the Schottky barrier diode 1, the forward voltage can be lowered in accordance with the large area of the Schottky junction surface S.

When a forward bias is applied to the trench MOS type diode 31, a current flows in the forward direction from the Schottky junction surface S formed outside the trenches 32 toward the cathode electrode 3 as shown in FIG. 5A. In the trench MOS type diode 31, the area of the Schottky junction surface S is smaller than in the planar type diode 21 and thus the amount of current that can be made to flow forward is low.

When a forward bias is applied to the trench diffusion type diode 41, a current flows in the forward direction from the Schottky junction surface S formed outside the impurity diffusion layers 42 toward the cathode electrode 3 as shown in FIG. 6A. In the trench diffusion type diode 41, the area of the Schottky junction surface S is smaller than in the planar type diode 21 and thus the amount of current that can be made to flow forward is low. Unlike in the trench MOS type diode 31, a small amount of current flows toward the cathode electrode 3 from the bottom surfaces of the impurity diffusion layers 42 in the trench diffusion type diode 41.

Cases of applying a reverse bias to the respective diodes shall now be described.

As shown in FIG. 3B, FIG. 4B, FIG. 5B, and FIG. 6B, in each diode, a depletion layer 50 spreads from the Schottky junction surface S into the top layer portion of the epitaxial layer 4. A boundary of the depletion layer 50 is indicated by broken lines.

In the case of the Schottky barrier diode 1 according to the preferred embodiment of the present invention, the depletion layer 50 spreads in an uneven form from the Schottky junction surface S in accordance with the Schottky junction surface S of uneven form as shown in FIG. 3B. The depletion layer 50 is thick at the mesa portions 8 between the trenches 7 and thin near the bottom portions of the trenches 7. In the example of FIG. 3B, the depletion layer 50 of each mesa portion 8 stays within a region inside the mesa portion 8 and hardly influences the depletion layer 50 near the bottom portions of the trenches 7. If a leak current arises when a reverse bias is applied, the leak current will flow to the anode electrode 9 side through the thin depletion layer 50 near the bottom portion of each trench 7. That is, the leak current characteristics are dependent on the thickness of the depletion layer 50 near the bottom portions of the trenches 7. The thickness of the depletion layer 50 in the bottom portion of the trench 7 can be adjusted by varying the dimensions (the width W, depth D, and pitch P) of the trenches 7. Leak current characteristics of the same level as those of the planar type diode 21 to be described next can thereby be realized.

In the case of the planar type diode 21, the depletion layer 50 runs parallel to the flat Schottky junction surface S and its thickness is substantially uniform as shown in FIG. 4B. Thus, if a leak current arises when a reverse bias is applied, the leak current flows to the anode electrode 9 side bypassing through the entirety of the depletion layer 50 substantially uniformly.

In the case of the trench MOS type diode 31, the depletion layer 50 spreads from each trench 32 and surrounds each trench 32 as shown in FIG. 5B. Thus, if a leak current arises when a reverse bias is applied, the leak current flows to the anode electrode 9 side by passing through constricted regions between the depletion layers 50 spreading from adjacent trenches 32.

In the case of the trench diffusion type diode 41, the depletion layer 50 spreads from each impurity diffusion layer 42 and surrounds each impurity diffusion layer 42 as shown in FIG. 6B. Thus, if a leak current arises when a reverse bias is applied, the leak current flows to the anode electrode 9 side by passing through constricted regions between the depletion layers 50 spreading from adjacent impurity diffusion layers 42.

In the trench MOS type diode 31 and the trench diffusion type diode 41, a current path during reverse biasing is constricted by the depletion layers 50 spreading from adjacent trenches 32 or the depletion layers 50 spreading from adjacent impurity diffusion layers 42. The leak current can thus be lessened.

As described above, with the Schottky barrier diode 1 according to the preferred embodiment of the present invention, a larger forward current (lower forward voltage) can be realized in comparison to any of the planar type diode 21, the trench MOS type diode 31, and the trench diffusion type diode 41 and yet reverse characteristics (leak current characteristics) of the same level as those of the planar type diode 21 can be realized.

Figure 7A:
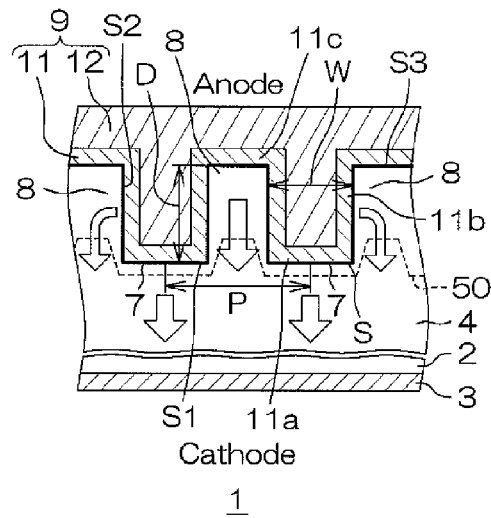
FIG. 7A is a schematic sectional view of principal portions of the Schottky barrier diode shown in FIG. 1.
Figure 7B:
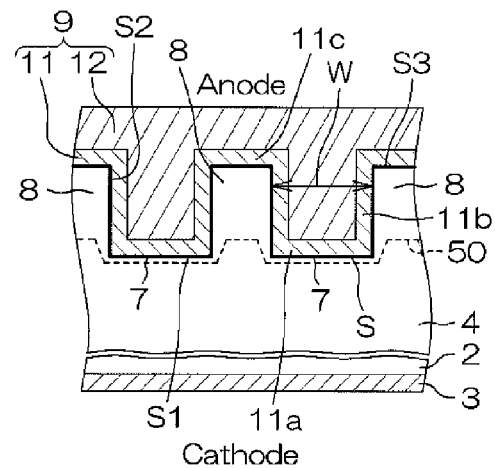
FIG. 7B shows a structure where a trench width in FIG. 7A is increased.
Figure 7C:
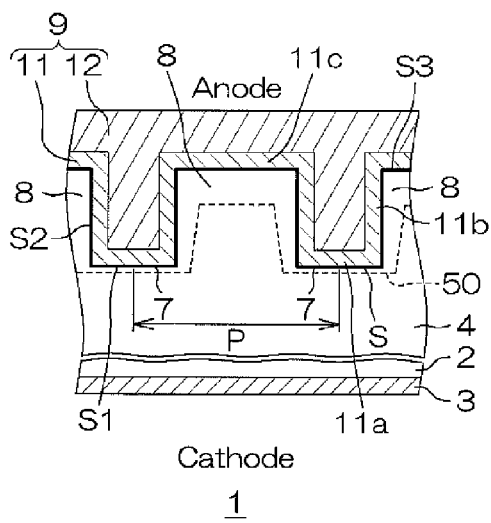
FIG. 7C shows a structure where a trench interval (pitch) in FIG. 7A is widened.
Figure 7D:
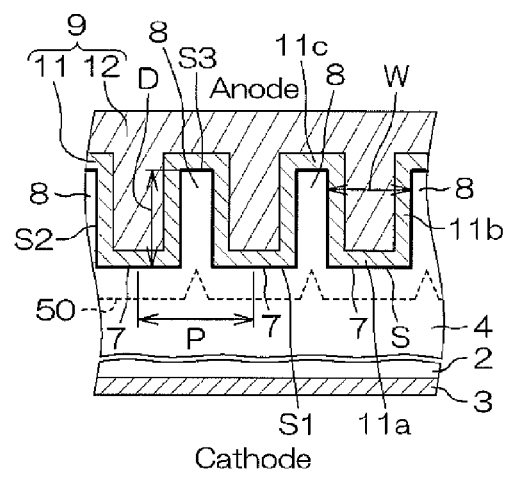
FIG. 7D shows a structure where the trench interval in FIG. 7A is narrowed.

FIG. 7A is a schematic sectional view of principal portions of the Schottky barrier diode shown in FIG. 1. FIG. 7B shows a structure where the trench width W in FIG. 7A is increased. FIG. 7C shows a structure where the trench interval (pitch P) in FIG. 7A is widened. FIG. 7D shows a structure where the trench interval in FIG. 7A is narrowed.

With the dimensions of the trenches 7 in FIG. 7A as bases, just the width W is increased with the depth D and the pitch P being fixed as shown in FIG. 7B. A proportion of the thin depletion layer 50 near the bottom portions of the trenches 7 with respect to the entirety of the depletion layer 50 is thereby made high. In this case, the area of the bottom surface of each trench 7 is large and thus a larger current can be made to flow or the forward voltage can be decreased during forward biasing. However, if the width W is too large, the leak current during reverse biasing may be high.

Next, with the dimensions of the trenches 7 in FIG. 7A as bases, just the width of each mesa portion 8 is increased with the depth D and the width W being fixed as shown in FIG.

7C. In this case, the depletion layer 50 thins at each mesa portion 8. Thus, during reverse biasing, a leak current may flow not just near the bottom portions of the trenches 7 but also in the respective mesa portions 8, and the leak current may thus increase in comparison to the case of FIG. 7A.

With the dimensions of the trenches 7 in FIG. 7A as bases, just the width of each mesa portion 8 is decreased with the depth D and the width W being fixed as shown in FIG. 7D. The depletion layer 50 at each mesa portion 8 then fills a region inside the mesa portion 8 and spreads to a region at the cathode electrode 3 side beyond the mesa portion 8. The depletion layer 50 at the mesa portions 8 thereby influences the depletion layer 50 near the bottom portions of the trenches 7. That is, the depletion layer 50 thickens near the bottom portions of the trenches 7. The leak current during reverse biasing is thus lessened due to being impeded by the depletion layer 50 near the bottom portions of the trenches 7.

Also, in FIG. 7D, the number of trenches 7 is increased by decreasing just the width of the mesa portions 8 and keeping the width W fixed, and thus the total of the bottom areas of the trenches 7 can be increased as in the case of widening the width W of the trenches 7. A larger current can thereby be made to flow and the forward voltage can be decreased further during forward biasing.

That is, by decreasing the width of the mesa portions 8 with the depth D and the width W being at optimal values, the leak current during reverse biasing can be reduced while making a large current flow and decreasing the forward voltage during forward biasing.

Specifically, in this case, the width of each mesa portion 8 is preferably 0.2 µm to 1.0 µm. The depth D is preferably 0.1 µm to 1.0 µm and more preferably 0.5 µm to 0.6 µm. The ratio of the width of each mesa portion 8 with respect to the depth D (the value obtained by dividing the width of each mesa portion 8 by the depth D) is preferably in a range of no less than 0.2 (=0.2/1.0) and no more than 10 (=1.0/0.1) and more preferably in a range of no less than 0.33 (=0.2/0.6) and no more than 2 (=1.0/0.5). Also, the width W is preferably approximately 0.5 µm.

As described above, with the Schottky barrier diode 1, the plurality of trenches 7 are formed in the top layer portion of the epitaxial layer 4, and the Schottky metal 11 contacts the surface of the epitaxial layer 4 including the inner surfaces of the trenches 7. The area of the Schottky junction surface S can thus be made greater than the apparent area of the surface of the epitaxial layer 4 in plan view when the top surface of the epitaxial layer 4 is viewed downward along the direction of the normal thereto. That is, the Schottky junction surface S can be formed on the inner surfaces of the trenches 7 and the top surface of the epitaxial layer 4 outside the trenches 7 (the top surfaces of the mesa portions 8). The total of these areas is greater than the apparent area of the epitaxial layer 4 in plan view. The Schottky barrier diode 1 having the large Schottky junction surface S even with a small chip size is thereby realized. Consequently, the Schottky barrier diode 1 of large rated current or the Schottky barrier diode 1 of low forward voltage can be realized with a compact chip size.

Also, the depletion layer 50 spreading from the Schottky junction surface S is thick near the mesa portions 8 formed between adjacent trenches 7 and is thin near the bottom portions of the trenches 7. The thick depletion layer 50 near the mesa portions 8 contributes to the reduction in the leak current during reverse bias application.

As shown in FIG. 7C, when the width of each mesa portion 8 between the trenches 7 is wide, the depletion layer 50 at each mesa portions 8 stays within the region inside the mesa portion 8. In this case, the depletion layer 50 is thin near the bottom portions of the trenches 7 and thus the leak current may be high near the bottom portions of the trenches 7 during reverse biasing. Further, the reduction amount of the forward voltage is low because the increase in the area of the Schottky junction surface S is also low.

On the other hand, when the width of each mesa portion 8 between the trenches 7 is narrow, the depletion layer 50 at the mesa portions 8 spreads to regions outside the mesa portions 8 and the depletion layer 50 thus thickens near the bottom portions of the trenches 7 as shown in FIG. 7D. Although the leak current during reverse biasing can thereby be reduced, the serial resistance of the mesa portions 8 increases and effects of current increase and forward voltage reduction are thus decreased. Thus, by setting the width of each mesa portion 8 in the range of 0.2 µm to 1.0 µm, the depletion layer 50 can be made to have a thickness of appropriate value near the bottom portions of the trenches 7. Specifically, in comparison to the planar type (Schottky barrier) diode 21 (see FIG. 4A and FIG. 4B) of the same chip size, a larger current can be made to flow, the forward voltage can be decreased, and the reverse leak current can be suppressed to a similar level. Also, in each trench 7, current flows not only from the bottom surface but also from vicinities of bottom portions of the inner surfaces besides the bottom surface, and thus, by securing the inner surfaces to be as large as possible, a greater current can be made to flow to decrease the forward voltage. For this purpose, the pitch P between trenches 7 is made narrow to increase the number of the trenches 7.

Also, when the trenches 7 are deep, the depletion layer 50 at the mesa portions 8 do not readily fill the mesa portions 8 and thus the depletion layer 50 thins at the bottom portions of the trenches 7. When the trenches 7 are shallow, the depletion layer 50 at the mesa portions 8 readily fill the mesa portions 8 and spread to regions outside the mesa portions 8 and thus the depletion layer 50 thickens at the bottom portions of the trenches 7. Thus, by setting the depth D of the trenches 7 in the range of 0.1 µm to 1.0 µm, the depletion layer 50 can be made to have a thickness of appropriate value near the bottom portions of the trenches 7. Specifically, in comparison to the planar type diode 21 (see FIG. 4A and FIG. 4B) of the same chip size, a larger current can be made to flow, the forward voltage can be decreased, and the reverse leak current can be suppressed to a similar level.

Also, in the present preferred embodiment, the plurality of trenches 7 are formed in a stripe form (see FIG. 1). When the trenches 7 are formed in the stripe form, the pitch P and the width W of the trenches 7 (see FIG. 3A) can be controlled accurately in the manufacturing process. Device characteristics can thereby be obtained readily as designed.

FIG. 8A to FIG. 8F are schematic perspective views of Schottky barrier diodes according to first to sixth modification examples and each shows a portion of the arrangement in a broken-away manner. As in FIG. 1, the sectioning planes of the respective portions are shifted for convenience of description in FIG. 8A to FIG. 8F.

Figure 8A:
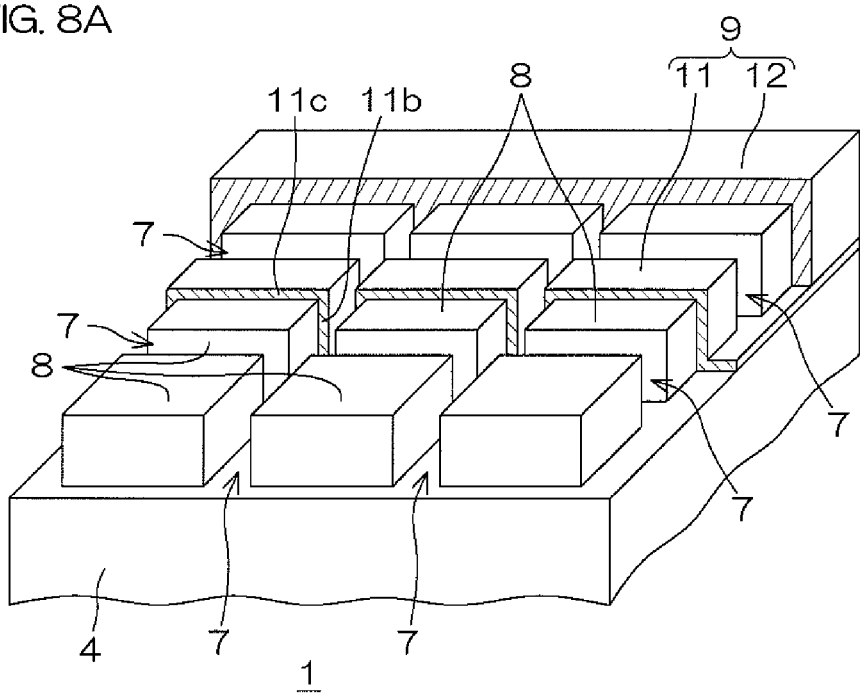
FIG. 8A is a schematic perspective view, partially broken away and viewed from obliquely above, of a Schottky barrier diode according to a first modification example.

In FIG. 8A, the trenches 7 are formed along two orthogonal directions. That is, the trenches 7 are formed to take a lattice form in plan view. In this case, the total area of the inner surfaces of the trenches 7 formed in the top layer portion of the epitaxial layer 4 increases and thus the area of the Schottky junction surface S can be increased further.

Figure 8B:
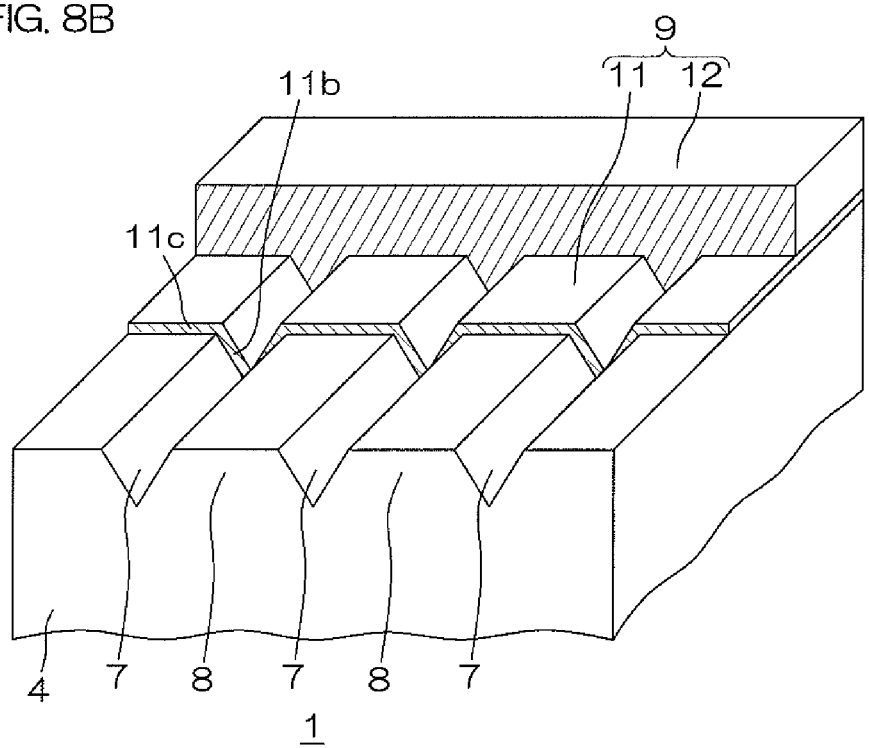
FIG. 8B is a schematic perspective view, partially broken away and viewed from obliquely above, of a Schottky barrier diode according to a second modification example.

In FIG. 8B, the cross section of each of the trenches 7 formed in stripe form is formed to a substantially inverted triangular shape that narrows toward the bottom. The area of the Schottky junction surface S is made greater than the apparent area of the epitaxial layer 4 in plan view with this arrangement as well.

Figure 8C:
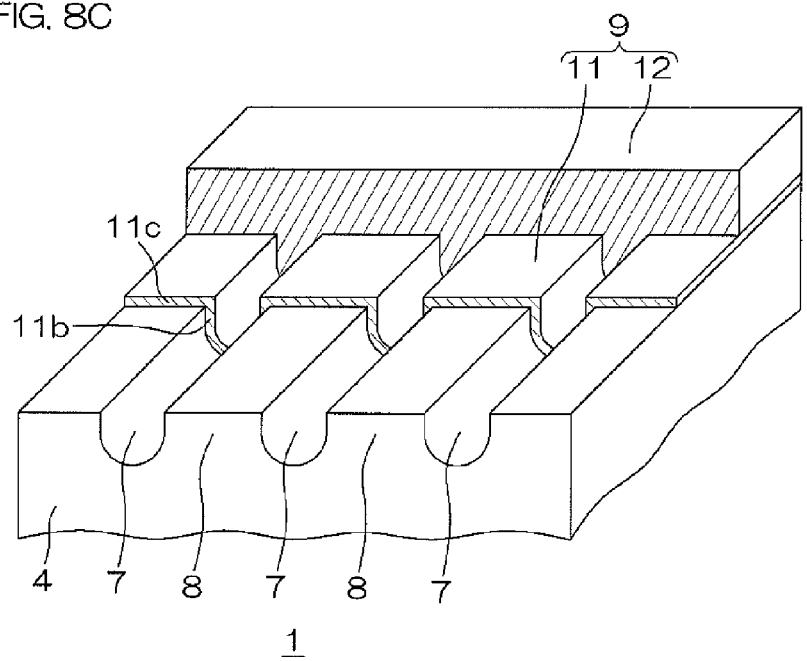
FIG. 8C is a schematic perspective view, partially broken away and viewed from obliquely above, of a Schottky barrier diode according to a third modification example.

In FIG. 8C, the cross section of each of the trenches 7 formed in stripe form is formed to a semicircular shape that is arcuately recessed toward the bottom. The area of the Schottky junction surface S is made greater than the apparent area of the epitaxial layer 4 in plan view with this arrangement as well. Further, the arrangement of FIG. 8C may be modified in accordance with the arrangement of FIG. 8A to form the trenches 7 of arcuate cross section in lattice form.

Figure 8D:
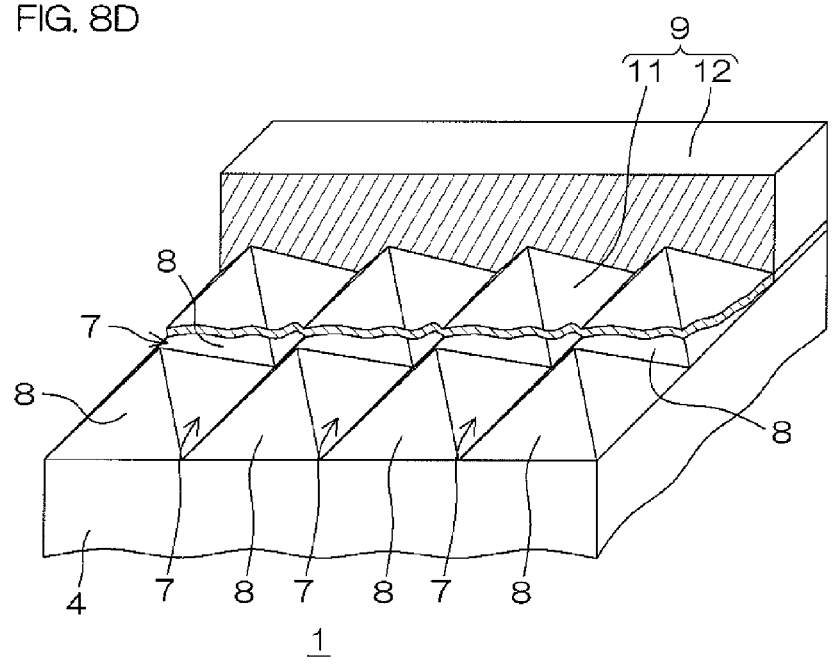
FIG. 8D is a schematic perspective view, partially broken away and viewed from obliquely above, of a Schottky barrier diode according to a fourth modification example.

In FIG. 8D, the trenches 7 having the substantially inverted triangular cross section are formed to take a lattice form in plan view. Adjacent trenches 7 are continuous. The area of the Schottky junction surface S is made greater than the apparent area of the epitaxial layer 4 in plan view with this arrangement as well. The trenches 7 having the substantially inverted triangular cross section may also be formed in lattice form at lateral and longitudinal intervals.

Figure 8E:
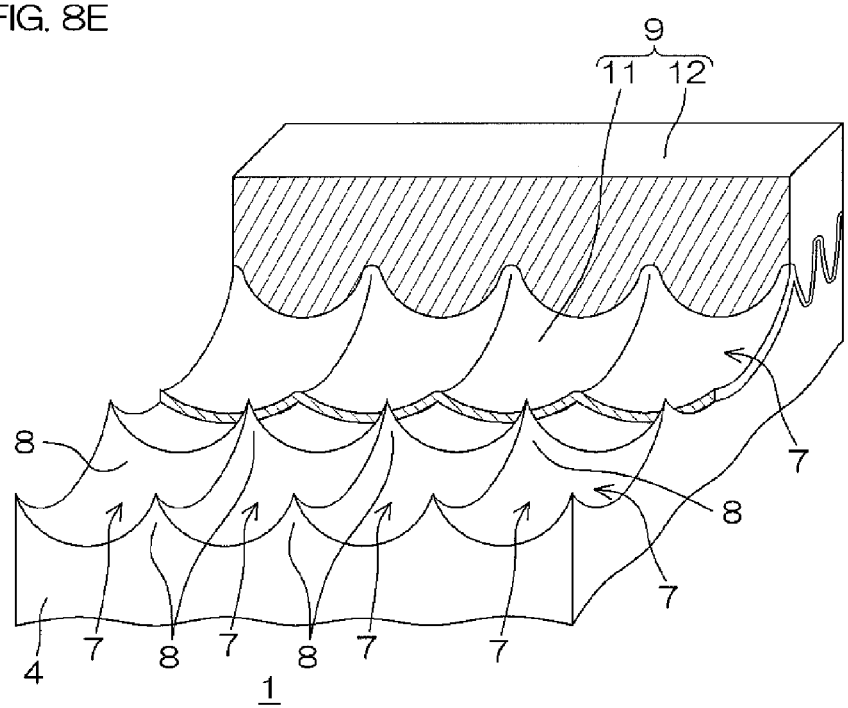
FIG. 8E is a schematic perspective view, partially broken away and viewed from obliquely above, of a Schottky barrier diode according to a fifth modification example.

In FIG. 8E, the trenches 7 of partial-spherical forms are formed so as to be continuous laterally and longitudinally. The area of the Schottky junction surface S is made greater than the apparent area of the epitaxial layer 4 in plan view with this arrangement as well.

Figure 8F:
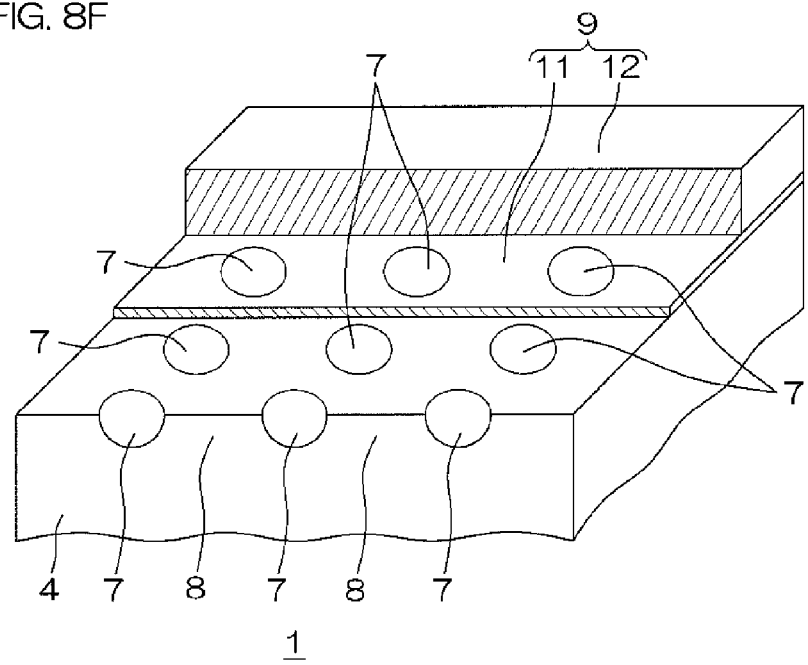
FIG. 8F is a schematic perspective view, partially broken away and viewed from obliquely above, of a Schottky barrier diode according to a sixth modification example.

In FIG. 8F, the plurality of trenches 7 that are recessed substantially semispherically from the top surface of the epitaxial layer 4 are formed at predetermined intervals in the top surface of the epitaxial layer 4. The trenches 7 shown in FIG. 8F are formed to hole shapes positioned discretely in two dimensions. The area of the Schottky junction surface S is made greater than the apparent area of the epitaxial layer 4 in plan view with this arrangement as well.

While preferred embodiments of the present invention have been described in detail above, these are merely specific examples for clarifying the technical contents of the present invention, the present invention should not be interpreted as being restricted to the specific examples, and the scope of the present invention is to be restricted solely by the attached claims.

What is claimed is:

1. A Schottky barrier diode comprising:
    a semiconductor layer having a conductivity type, and having a plurality of trenches formed by digging in from a top surface and having mesa portions formed between adjacent trenches; and
    a single layer Schottky metal formed to contact a surface of the semiconductor layer including inner surfaces of the plurality of trenches, the single layer Schottky metal having a Schottky junction surface at which the single layer Schottky metal and the surface of the semiconductor layer are in Schottky contact, the Schottky junction surface including at least bottom surface portions of the single layer Schottky metal being in Schottky contact with bottom surfaces of the plurality of trenches, side surface portions of the single layer Schottky metal being in Schottky contact with side wall surfaces of the plurality of trenches and upper surface portions of the single layer Schottky metal being in Schottky contact with upper surfaces of the mesa portions,
    wherein the bottom surfaces of the plurality of trenches, the side wall surfaces of the plurality of trenches and the upper surfaces of the mesa portions contacting with the single layer Schottky metal have a same conductivity type;
    wherein a ratio between a width of an upper surface of a mesa portion of the mesa portions being in Schottky contact with the single layer Schottky metal and a length of a side wall surface of a trench of the plurality of trenches being in Schottky contact with the single layer Schottky metal is 0.2 to 10; and
    wherein the mesa portions and the plurality of trenches are arranged such that a depletion layer at each of the mesa portions causes a depletion layer at a bottom of each of the plurality of trenches to thicken when a reverse bias is applied to the Schottky barrier diode, and such that the depletion layer at each of the mesa portions extends from the upper surfaces of the mesa portions to a position at substantially a same height as upper surfaces of the bottom surface portions of the single layer Schottky metal and higher than the bottom surfaces of the plurality of trenches.

2. The Schottky barrier diode according to claim 1, wherein each of the mesa portions has a width of 0.2 μm to 1.0 μm.

3. The Schottky barrier diode according to claim 1, wherein each of the plurality of trenches has a depth of 0.1 μm to 1.0 μm.

4. The Schottky barrier diode according to claim 1, wherein a ratio of a mesa portion width with respect to a trench depth is 0.2 to 10.

5. The Schottky barrier diode according to claim 1, wherein the plurality of trenches are formed in a stripe form.

6. The Schottky barrier diode according to claim 1, wherein the single layer Schottky metal contacts the surface of the semiconductor layer at the inner surfaces of the plurality of trenches and outside the plurality of trenches.

7. The Schottky barrier diode according to claim 1, wherein the single layer Schottky metal covers entireties of the inner surfaces of the plurality of trenches and extends continuously outside the plurality of trenches.

8. The Schottky barrier diode according to claim 1, further comprising a contact metal embedded in respective trenches so as to contact the single layer Schottky metal covering inner surfaces of the respective trenches.

9. The Schottky barrier diode according to claim 8, wherein the single layer Schottky metal is made of Ti, the contact metal is made of Al, and a titanium nitride layer is interposed between the single layer Schottky metal and the contact metal.

10. The Schottky barrier diode according to claim 1, wherein a cross section of each trench of the plurality of trenches has a rectangular shape.

11. The Schottky barrier diode according to claim 1, wherein the plurality of trenches are formed in lattice form.

12. The Schottky barrier diode according to claim 1, wherein a cross section of each trench of the plurality of trenches has a substantially inverted triangular shape that narrows toward a bottom.

13. The Schottky barrier diode according to claim 1, wherein a cross section of each trench of the plurality of trenches has a semicircular shape that is arcuately recessed toward a bottom.

14. The Schottky barrier diode according to claim 1, wherein the plurality of trenches have an arcuate cross section and are formed in lattice form.

15. The Schottky barrier diode according to claim 1, wherein the plurality of trenches, each having a cross section of substantially inverted triangular shape, are formed in lattice form.

16. The Schottky barrier diode according to claim 1, wherein the plurality of trenches, each having a partially spherical shape, are formed continuously laterally and longitudinally.

17. The Schottky barrier diode according to claim 1, wherein the plurality of trenches, each of which is recessed in substantially semispherical form, are formed at predetermined intervals on the surface of the semiconductor layer.

18. The Schottky barrier diode according to claim 1, wherein the mesa portion of the mesa portions has a width that is narrower than respective widths of a pair of the plurality of trenches adjacent to the mesa portion of the mesa portions.

* * * * *